United States Patent
Schneegans et al.

(10) Patent No.: US 6,790,737 B2
(45) Date of Patent: Sep. 14, 2004

(54) METHOD FOR FABRICATING THIN METAL LAYERS FROM THE LIQUID PHASE

(75) Inventors: Manfred Schneegans, Vaterstetten (DE); Wolfgang Jaeger, Baldham (DE); Michael Rogalli, Rottenburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/390,872

(22) Filed: Mar. 17, 2003

(65) Prior Publication Data

US 2003/0181037 A1 Sep. 25, 2003

(30) Foreign Application Priority Data

Mar. 15, 2002 (DE) .......................... 102 11 544

(51) Int. Cl.⁷ ............................................. H01L 21/20
(52) U.S. Cl. ...................... 438/368; 438/391; 438/674; 438/681; 438/685; 438/686
(58) Field of Search ............................. 438/386, 391, 438/674–675, 681, 685–686, 678–679

(56) References Cited

U.S. PATENT DOCUMENTS

| | | | |
|---|---|---|---|
| 5,728,626 A | * | 3/1998 | Allman et al. .............. 438/608 |
| 5,905,279 A | | 5/1999 | Nitayama et al. |
| 5,953,629 A | | 9/1999 | Imazeki et al. |
| 6,271,131 B1 | * | 8/2001 | Uhlenbrock et al. ........ 438/681 |
| 6,281,124 B1 | * | 8/2001 | Vaartstra ..................... 438/681 |
| 2001/0055877 A1 | * | 12/2001 | Vaartstra ..................... 438/681 |
| 2003/0022457 A1 | * | 1/2003 | Gutsche et al. ............. 438/386 |
| 2003/0165615 A1 | * | 9/2003 | Aaltonen et al. ............. 427/79 |

FOREIGN PATENT DOCUMENTS

| | | |
|---|---|---|
| DE | 100 34 003 A1 | 1/2002 |
| EP | 1 073 115 A2 | 1/2001 |
| EP | 1 107 298 A2 | 6/2001 |
| EP | 1 158 073 A1 | 11/2001 |
| JP | 09148248 A | 6/1997 |

* cited by examiner

*Primary Examiner*—Lynne A. Gurley
(74) *Attorney, Agent, or Firm*—Laurence A. Greenberg; Werner H. Stemer; Gregory L. Mayback

(57) ABSTRACT

A method for producing metal layers on surfaces of semiconductor substrates includes the step of providing a semiconductor substrate having a surface. In this case, a precursor compound of a metal to be deposited is condensed out on the semiconductor surface and subsequently decomposed thermally. The method makes it possible to fill trenches with a high aspect ratio, it being possible to effectively suppress the formation of voids.

12 Claims, 9 Drawing Sheets

METHOD FOR FABRICATING THIN METAL LAYERS FROM THE LIQUID PHASE

BACKGROUND OF THE INVENTION

Field of the Invention

The invention relates to a method for producing metal layers on semiconductor substrates.

Economic success in the semiconductor industry is substantially influenced by further reduction of the minimum feature size that can be fashioned on a microchip. Reducing the minimum feature size makes it possible to increase the integration density of the electronic components, such as transistors or capacitors, on the microchip and hence to increase the computing speed of processors and also to increase the storage capacity of memory modules. In order to keep down the area requirement of the components on the chip surface, a depth of the substrate is also utilized for capacitors. To that end, first a trench is introduced into a wafer. Afterward a bottom electrode is produced, for example by the regions of the wafer that adjoin the wall of the trench being doped in order to increase the electrical conductivity. A thin layer of a dielectric is then applied to the bottom electrode. Finally, the trench is filled with an electrically conductive material in order to obtain a counter electrode.

The counter electrode is also referred to as a top electrode. The configuration of electrodes and dielectric results in that the capacitor is virtually folded. With consistently large electrode areas, that is to the same capacitance, it is thereby possible to minimize the lateral extent of the capacitor on the chip surface. Such capacitors are also referred to as "deep trench" capacitors.

In memory chips, the charged and discharged states of the capacitor correspond to the two binary states 0 and 1, respectively. In order to be able to reliably determine the charge state of the capacitor and thus the information stored in the capacitor, the latter must have a specific minimum capacitance. If the capacitance or, in the case of a partly discharged capacitor, the charge falls below the limit value, the signal disappears in the noise, that is to say the information about the charge state of the capacitor is lost. After writing, the capacitor is discharged by leakage currents that bring about a charge balancing between the two electrodes of the capacitor. With decreasing dimensions, the leakage currents increase since tunneling effects gain in importance. In order to counteract a loss of information through the discharge of the capacitor, the charged state of the capacitor is checked at regular intervals and if appropriate refreshed, that is to say a partly discharged capacitor is charged again up to its original state. However, technical limits are imposed on these so-called "refreshing" times, that is to say they cannot be shortened arbitrarily. During the period of the refreshing time, therefore, the charge of the capacitor is permitted to decrease only to an extent such that reliable determination of the charge state is possible. For a given leakage current, the capacitor must therefore have a specific minimum charge at the beginning of the refreshing time, so that, at the end of the refreshing time, the charge state is still high enough above the noise to be able to reliably read out the information stored in the capacitor. In order to be able to achieve a sufficient capacitance of the capacitors with low leakage currents even in the case of advancing miniaturization, a multiplicity of solution approaches are being pursued. Thus, by way of example, the surface of the electrodes is provided with a structure in order that, as the length and width of the electrodes decrease, the surface thereof is made as large as possible. Furthermore, new materials are being used. Thus, attempts are being made to replace the silicon dioxide, which has been used hitherto as a dielectric, by materials with a higher dielectric constant.

As electrode material, polysilicon is currently used to fill the trench. With further miniaturization, that is to say a smaller diameter of the trench, the layer thickness of the conductive material decreases, so that the electrical conductivity of the polysilicon no longer suffices to provide the required charge.

In order to combat a loss of capacitance of the capacitors in the context of advancing miniaturization, electrodes made of metals having higher electrical conductivity, for example platinum or tungsten, are used instead of the currently used electrodes made of doped polysilicon. As a result, it is possible to suppress depletion zones in the electrodes and thus to fabricate thinner electrodes which nevertheless provide the required charge density on the electrodes.

U.S. Pat. No. 5,905,279 describes a trench capacitor in which, in addition to polysilicon, further electrically conductive materials, such as WSi, TiSi, W or Ti are also used to fill the trenches.

Trench capacitors have a very high aspect ratio of usually more than 60. The term aspect ratio denotes the ratio of the extent of the capacitor in its longitudinal direction, that is to say into the depth of the substrate, to the diameter of the opening of the capacitor at the surface of the substrate. The high aspect ratio leads to difficulties in the construction of the trench capacitor. A trench which has been introduced into the wafer for the construction of a trench capacitor has, on the one hand, a very small opening at the substrate surface, through which substances can be transported into the trench in order to be deposited there, but, on the other hand, a very large extent into the depth of the substrate, in which case the material to be deposited has to be able to penetrate down to the bottom of the trench. During the deposition of layers in the trench, for example in order to produce a dielectric disposed between the bottom electrode and the top electrode, the layer thickness is intended to be as uniform as possible in the entire trench. Only a few methods are suitable for fabricating such layers. The deposition is usually effected with the aid of a chemical vapor deposition (CVD) or atomic layer deposition (ALD) method. In this case, use is made of gaseous precursors that are converted into the desired compounds at the substrate surface. In the CVD method, the reactants are simultaneously situated in the gas space above the substrate. The material to be deposited is deposited as a result of the conversion of the reactants on the substrate surface. With this method, relatively thick layers can be produced in comparatively short times, but fluctuations in the layer thickness, caused for example by flow effects, have to be accepted. In the ALD method, the layers are constructed by depositing individual layers of the various reactants. Thus, only ever one reactant is situated in the gas space above the substrate, and is deposited in a monomolecular layer on the substrate. Afterward, excess reactant is removed from the gas space, for example by pumping away or flushing with an inert gas, after which a further reactant is introduced into the gas space above the substrate. The further reactant reacts with the reactant previously bonded as a monomolecular layer on the substrate, and likewise forms a monomolecular layer. This makes it possible to fabricate very uniform layers with a defined layer thickness. Both CVD and ALD methods require gaseous reactants. Furthermore, on the one hand the reactants must be sufficiently reactive to be able to produce a layer in tenable process times; on the other hand the reactants must also be stable enough not to decompose before the actual deposition. In the case of the ALD method, the reactant must be able to form a monomolecular layer that remains stable until the deposition of the further reactant. This greatly restricts the selection of the reactants. Such precursor compounds are not available for a relatively large number of metals. Furthermore, the reaction products liberated during the reaction of the reactants must not attack the substrate. Thus, by way of example, $WF_6$ as a gaseous precursor compound is used for the fabrication of thin tungsten layers on a silicon substrate, in which case, fluorine is liberated during the conversion to form the tungsten metal, which fluorine attacks the silicon of the substrate. In order to inhibit destruction of the substrate by the liberated fluorine, therefore, a diffusion barrier layer, containing TiN, for example, has to be applied before the deposition of the tungsten layer. These diffusion barrier layers are applied in dedicated physical vapor deposition (PVD) installations. This requires an additional production step in the fabrication of the microchips, which lengthens the fabrication time and is also disadvantageous from cost standpoints owing to the outlay on apparatus.

If the above-described CVD and ALD methods for filling trench capacitors are used for producing a counter electrode or else for filling contact holes in semiconductor circuits, voids form within the electrode or the contact along the axis. This difficulty arises in particular in CVD methods. In the methods described above, the layer grows approximately uniformly at all inner areas of the trench. This reduces the inner space in the course of the progressive layer formation to form a channel. CVD methods exhibit slightly increased deposition rates at the upper edges of the trenches or the contact holes. As a result, the growing layers at the upper edges close off the underlying voids in the trenches or the contact holes and complete filling by a further deposition does not happen at these locations. The result is closed, occasionally hose-like voids, or else open channels. This leads to a series of difficulties during the further processing of the deposited metal layers. During the fabrication of trench capacitors, by way of example, the metal filling is first of all removed again in the upper region of the trench by anisotropic etching, in order subsequently to produce an insulating collar. This opens the voids present within the metal filling, so that a precise end-point determination for the etching step is not possible. Furthermore, during etching, a planar surface is not obtained on the top side of the metal filling, rather a funnel-shaped structure forms as a result of the channel present within the metal filling.

In the CVD method, the metal layer is deposited not just in the trenches but uniformly on all surfaces of the wafer. The excess material on the top side of the wafer is removed again after deposition by a chemical mechanical polishing (CMP). In this case, voids disposed within the deposited metal layer may be opened and polishing agent can then penetrate into the voids, the components of which polishing agent act as a source of contamination in subsequent metal depositions.

The difficulties outlined above occur to a lesser extent in ALD methods since the layers are deposited very uniformly in this case. However, the layer growth in ALD methods is very small in comparison with customary CVD methods, which slows down production and, as a consequence, leads to an increase in the costs. With ALD methods, too, the difficulty of channel formation along the axis of the metal filling of trenches or contact holes cannot be eliminated since, in this case, too, the layer growth gradually constricts the trench interior.

Furthermore, depending on the precursor compounds used, it is necessary, in ALD methods too, first to introduce a diffusion barrier into the trench in order, during the fabrication of tungsten fillings, by way of example, to avoid damage to the substrate through fluorine being liberated from $WF_6$.

SUMMARY OF THE INVENTION

It is accordingly an object of the invention to provide a method for fabricating thin metal layers from the liquid phase that overcomes the above-mentioned disadvantages of the prior art methods of this general type, which can be carried out within short process times and which also makes it possible to fill trenches with a high aspect ratio without any faults, the intention being, in particular, to avoid the formation of voids.

With the foregoing and other objects in view there is provided, in accordance with the invention, a method for producing metal layers on surfaces of semiconductor substrates. The method includes the steps of providing a semiconductor substrate having a surface, applying at least one precursor compound of at least one metal in a fluid phase on at least parts of the surface, and decomposing the precursor compound for forming a metal layer.

In contrast to the CVD and ALD methods that have been customary heretofore, the precursor compound is not present in gaseous form at the surface of the substrate in order then to be deposited in solid form in a chemical reaction, but rather is applied in a fluid phase, that is to say as a liquid on the surface of the semiconductor substrate. A metal layer is then produced from the liquid phase in a second step by decomposition of the precursor compound. If the metal layer is produced in trenches, the latter are first filled at least partially with the fluid phase of the precursor compound, and the precursor compound is then decomposed to form the metal. As a result, the metal no longer grows layer by layer on all areas of the trench, but rather is deposited uniformly in the entire volume of the trench, so that channel formation along the axis of the trench no longer occurs. The decomposition can be controlled for example in such a way that the decomposition begins at the lower end of the trench and continues gradually in the direction of the trench opening. This can be achieved for example by producing a temperature gradient along the longitudinal axis of the trench and continuously increasing the temperature during the decomposition along the axis. The zone in which the decomposition temperature is reached then traverses the trench from bottom to top.

The method according to the invention can be used to produce metal layers that contain only one metal, for example tungsten. However, it is also possible to produce layers that contain different metals. In this case, the different metals may either form a common phase, that is to say be present in the form of an alloy; however, it is also possible to deposit the metals layer by layer, so that the metals are present separately in different layers.

A sequential production of the metal layer is advantageous particularly when filling trenches with a very high aspect ratio of more than 30, in particular more than 60, since a highly uniform metal filling can be obtained in this way. In this case, the precursor compound is first filled in fluid form into the lower section of the trench and is then decomposed to form a metal filling in the lower region. The precursor compound is then once again applied in fluid form to the metal filling and decomposed. In this way, the trench can be filled step by step from bottom to top, so that the formation of imperfections, in particular voids can be largely suppressed or completely avoided.

The metal may be present in the precursor compound intrinsically in an arbitrary oxidation state, provided that the precursor compound can be applied in an undecomposed fashion in fluid form on the surface of the semiconductor substrate. If the metal is present in the precursor compound in oxidized form, a corresponding reducing agent, for example hydrogen, must be made available for the decomposition of the precursor compound. However, in order to avoid contamination by the reducing agent or byproducts, the precursor compound preferably contains the metal in the zero oxidation state. The metal is then already present in the desired oxidation state, thereby obviating the need for a reducing agent. The precursor compound is preferably decomposed thermally. To that end, the precursor compound is applied on the surface of the semiconductor substrate at a first temperature, which lies below the decomposition temperature of the precursor compound. The temperature at which the precursor compound is applied preferably lies at least 10° C. below the decomposition temperature. In order to deposit the precursor compound at a specific temperature in liquid form, the pressure, for example, can be set correspondingly. Equally, the pressure should be chosen such that the precursor compound is still present in liquid form, that is to say is not boiling, at the decomposition temperature. The semiconductor substrate is subsequently heated, so that a controlled decomposition of the precursor compound occurs. The method is suitable in particular for precursor compounds that already contain the metal in the zero oxidation state. In this way, the metal can be fashioned in a highly pure form. In this case, the precursor compound is preferably selected such that, during its decomposition, only gaseous products are produced in addition to the metal, which gaseous products can easily be conducted away from the metal layer being formed.

In addition to a thermal decomposition, the precursor compound can also be decomposed for example by pressure treatment. This would be possible, for example, if the precursor compound present in liquid form is intended to be decomposed with the aid of hydrogen gas. For the decomposition, the pressure is lowered while the temperature can be kept constant.

As already explained further above, it is essential to the implementation of the method according to the invention that the precursor compound is first present in fluid form on the substrate. To that end, the precursor compound may be applied to the surface of the semiconductor substrate in a manner dissolved in an inert solvent, for example. In principle, although the precursor compound can be decomposed from the solution, the inert solvent should preferably have a sufficiently low boiling point so that it can easily be evaporated by heating or at reduced pressure. Fluorocarbons or chlorofluorocarbons are suitable, by way of example.

The precursor compound is preferably applied in condensed form to the surface of the semiconductor substrate. In this case, the precursor compound is already present in a pure form, so that it is possible to reduce the risk of contamination by the solvent or by byproducts resulting from the solvent. In this case, a precondition for carrying out the method according to the invention is that the precursor compound can also be provided in a pure form in the fluid phase under the process conditions. If appropriate, pressure and temperature, for example, may be chosen such that the precursor compound is present in liquid form.

The liquid phase of the precursor compound can be applied to the surface of the semiconductor substrate by customary methods, for example by spraying-on or dipping methods. The fluid phase of the precursor compound is particularly preferably applied to the surface of the semiconductor substrate in a spin-on method. In this case, first the precursor compound is applied to the substrate surface in the fluid phase. Afterward, excess precursor compound is spun off by rapid rotation of the semiconductor substrate, for example a silicon wafer.

However, the precursor compound is particularly preferably condensed out directly on the semiconductor substrate. To that end, the precursor compound is supplied in the gaseous form of the gas phase above the semiconductor substrate, in which, to that end, a temperature lying above the boiling point of the precursor compound is preferably set. The precursor compound is then condensed out on the semiconductor substrate, which, to that end, is cooled to a temperature lying below the condensation point of the precursor compound. In this case, the pressure prevailing in the gas space is set such that the precursor compound can be converted into the gas phase at a temperature lying as far as possible below the decomposition point of the precursor compound. The wafer is cooled to a correspondingly low temperature, so that the precursor compound condenses out in fluid form on the surface of the semiconductor substrate. Excess liquid precursor compound can be removed by being spun off, as described above.

In order to be able to achieve a reliable filling of the trench with the liquid precursor compound even in trenches with a high aspect ratio, in a preferred embodiment of the method according to the invention, a temperature gradient is produced perpendicularly to the opening of the trenches in the semiconductor substrate. In this embodiment, the trench thus has a lower temperature at its lower termination than in the sections adjacent to the opening of the trench. As a result, the precursor compound first condenses in the lower sections of the trench, so that the trench is filled with the precursor compound from bottom to top. During a subsequent thermal decomposition of the precursor compound, the temperature gradient is set in such a way that the temperature is chosen to be higher in the lower sections of the trench than in the sections that are adjacent to the opening of the trench. Such a temperature gradient can be produced for example by disposing the semiconductor substrate on a substrate carrier which can be cooled or heated, and by setting the temperature in the gas phase above the semiconductor substrate in accordance with the desired temperature gradient.

For carrying out the method according to the invention, the precursor compounds used are preferably those compounds that can easily be decomposed thermally without uncontrollable reactions, for example metal carbide formation, taking place. Therefore, the precursor compounds used are preferably metal complexes, having at least one metal atom and ligands bonded to the metal atom. The bond strength between the central metal atom and the ligands surrounding the central atom should be low in this case. In particular, compounds having π-electrons, which are bonded to the central atom via a π-bond, are suitable as ligand. Examples of suitable ligands are carbon monoxide, olefins, for example ethene, or cyclo olefins, for example cyclopentadiene. In this case the precursor compound may contain only one kind of ligands and be present for example as a metal carbonyl. However, compounds having mixed ligands in which, by way of example, some of the CO-ligands of a metal carbonyl are replaced by cyclopentadienyl groups are also suitable.

The method according to the invention can intrinsically be carried out for the fabrication of layers from arbitrary metals. The metals merely have to be able to form precursor compounds which can be applied to the semiconductor substrate in the fluid phase and which can readily be decomposed to form the desired metal. Particularly preferred metals are tungsten, molybdenum, nickel and titanium. The metals form metal complexes that can readily be decomposed thermally, for example metal carbonyls or metal cyclopentadienyl compounds. The thermal decomposition of $W(CO)_6$ proceeds in accordance with the following equation:

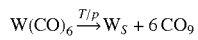

$$W(CO)_6 \xrightarrow{T/p} W_S + 6\,CO_9$$

The gaseous byproducts produced during the thermal decomposition of the precursor compound can easily be conducted away and if, like carbon monoxide, they are toxic, they can be converted into harmless compounds (e.g. $CO_2$) and disposed of without difficulty by customary gas screwers.

The resulting byproducts generally exhibit little chemical reactivity, so that there is no need for diffusion barrier layers for avoiding destruction of the substrate in this case.

The method according to the invention is suitable in particular for the fabrication of homogeneous metal layers even in trenches with a high aspect ratio. Therefore, trenches which are open toward the side of the top side of the substrate are preferably introduced into the semiconductor substrate, so that walls of the trenches are part of the substrate surface. In this case, the trenches preferably have an aspect ratio of more than 30, particularly preferably more than 60. The trenches serve in particular for fabricating trench capacitors and for fabricating contacts.

The method according to the invention is distinguished by a simple method technique for forming highly pure metals in trenches for trench capacitors and contact holes. In contrast to CVD methods, complicated vacuum installations requiring a complicated gas, vacuum and temperature regulating technology are not necessary. In particular in the context of fabricating counter electrodes in deep trench capacitors, by way of example, the complicated layer technique of alternate As and polysilicon layers in order to generate electrically conductive electrode material is obviated. A particular advantage of the method according to the invention is that the fillings of contact holes or trenches for deep trench capacitors can be carried out without the disturbing formation of voids. Since generally a diffusion barrier layer is not required, the result is a shorter cycle in the production sequence and hence a lower production outlay. The contacts for deep trench capacitors fabricated by the method according to the invention are distinguished by a higher process reliability owing to the lack of formation of voids in the metal layer.

Other features which are considered as characteristic for the invention are set forth in the appended claims.

Although the invention is illustrated and described herein as embodied in a method for fabricating thin metal layers from the liquid phase, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
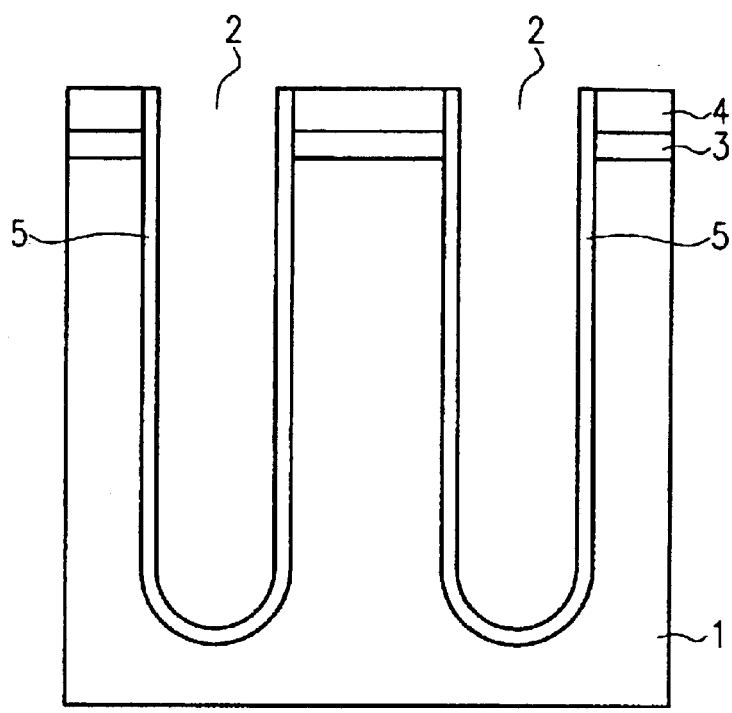
FIGS. 1A–1F are diagrammatic sectional views of individual work steps in the fabrication of a deep trench capacitor having a trench filled by a CVD method according to the prior art.
Figure 1B:
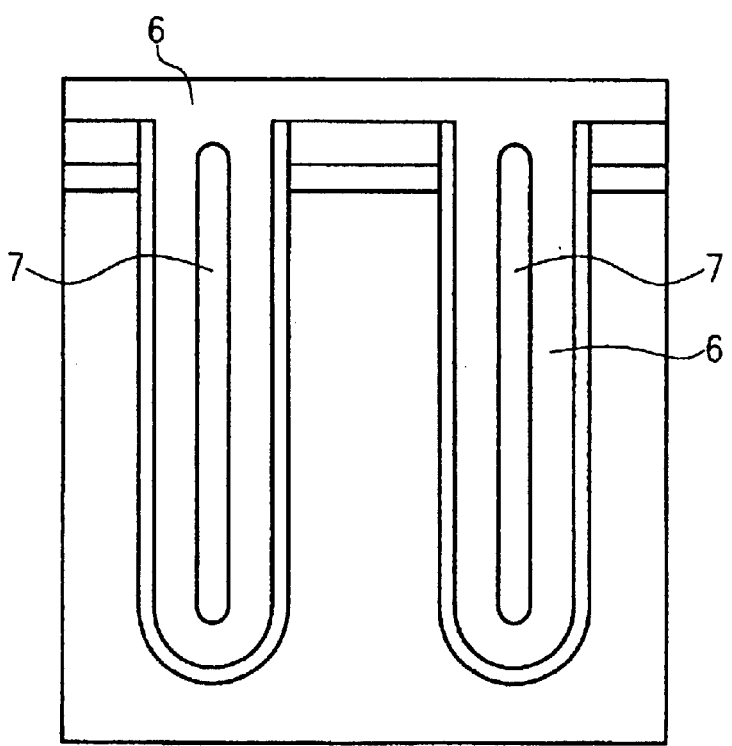
Figure 1C:
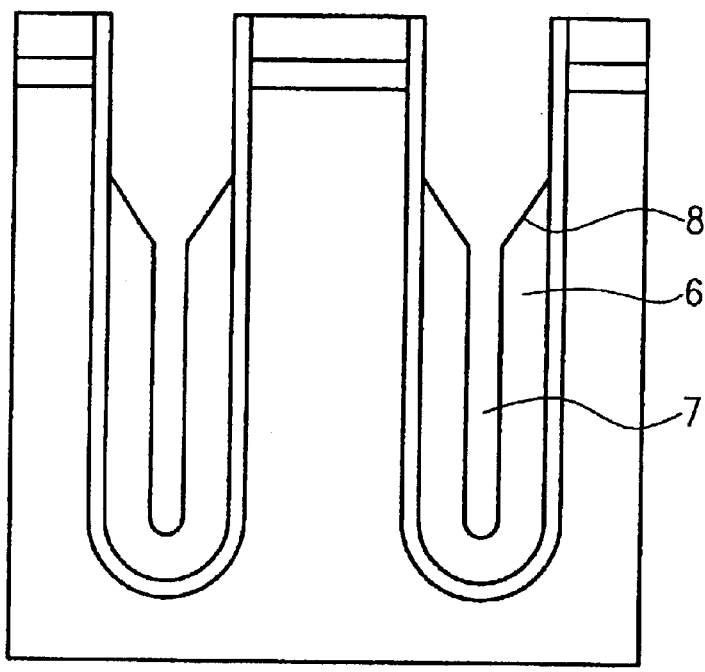

Referring now to the figures of the drawing in detail and first, particularly, to FIGS. 1A–1F thereof, there is shown various work steps in the fabrication of a deep trench capacitor. A top electrode of the capacitor being fabricated by conventional chemical vapor deposition (CVD) methods. In order to produce trenches, first a silicon wafer 1 is oxidized at its surface in an oxygen atmosphere in order to produce a thin oxide layer 3 having a thickness of about 5 nm. The oxidation on the one hand reduces stresses in the wafer and on the other hand provides an adhesion layer for further layers. A nitride layer 4 having a thickness of approximately 200 nm is subsequently deposited onto the oxide layer 3 by a CVD method. For the patterning of the nitride layer 4 and the definition of an opening of the trench capacitor, first a layer made of a hard mask material is then deposited on the wafer, for example a borosilicate glass. Afterward, a photoresist is applied, exposed in sections with the aid of a mask and developed by a developer in order to define openings having a diameter of approximately 100 nm for the trenches of the capacitor. The openings are then transferred into the layer of the hard mask by a process using a fluorine-containing plasma, the corresponding regions of the nitride layer 4 also being removed at the same time. After the removal of the photoresist layer, for example by incineration, trenches 2 are etched down to a depth of approximately 8 μm in the silicon wafer 1 by further fluorocarbon plasma. Finally, the hard mask is removed by a process using hydrofluoric acid, for example. The silicon wafer 1 now has trenches 2 whose wall is formed from the silicon of the wafer. For further processing, first, a thin oxide layer 5 having a thickness of approximately 10 nm is again produced on the wall of the trenches 2 by the uncovered silicon being thermally oxidized by oxygen. This yields a configuration as illustrated in FIG. 1A. FIG. 1A shows a section through the silicon wafer acting as the semiconductor substrate 1. The two trenches 2 are introduced into the semiconductor substrate 1, the trenches 2 being open toward a substrate surface. At its top side, the semiconductor substrate 1 is covered with the thin oxide layer 3 and the nitride layer 4 disposed on the latter. An inner wall of the trenches 2 is lined with a thin oxide layer 5, which forms the dielectric that isolates the electrodes in the completed capacitor. Polysilicon is subsequently deposited on the semiconductor substrate 1, so that the trenches 2 are completely filled with polysilicon 6 (FIG. 1B). The polysilicon is deposited by a CVD method, silane ($SiH_4$) being used as a reactive precursor compound. The polysilicon 6 grows proceeding from the walls of the trenches 2, so that the free space within the trenches 2 narrows as the growth of the polysilicon layer 6 progresses. Since the deposition rate is slightly higher at an upper edge of the trenches 2 than in the lower sections of the trenches 2, toward the end of the polysilicon deposition, the inner space of the trenches 2 is closed off with polysilicon and hose-like voids 7 form. With further deposition of polysilicon, the latter is deposited only on the top side of the wafer, while no more silicon is deposited in the voids 7. A state as is illustrated in FIG. 1B is obtained at the end of the deposition of the polysilicon. The trenches 2 are filled with the polysilicon 6, the hose-like void 7 having formed along the axis of the trenches 2. In the next step, the polysilicon 6 is etched back anisotropically, the silicon being removed at the top side of the semiconductor substrate 1 and also in the upper sections of the trenches 2. A state illustrated in FIG. 1C is obtained. The anisotropic etching-back has opened the hose-like voids 7, a funnel-shaped termination 8 having formed at the upper end of the filling made of polysilicon 6. Due to the void 7, material is not removed uniformly during anisotropic etching, so that it is not possible to obtain a planar area at the upper side of the fillings made of polysilicon 6. For this reason, it is also not possible for the end point of the etching-back to be determined precisely.

Figure 2A:
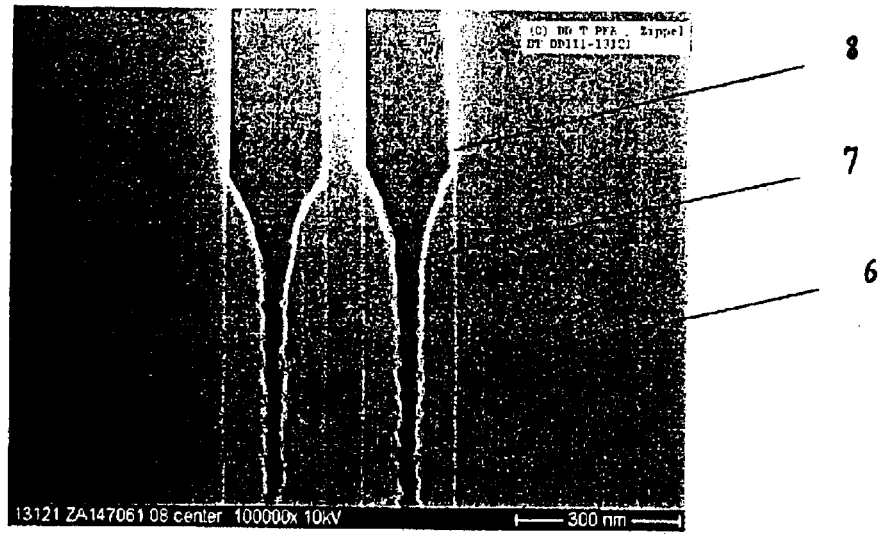
FIGS. 2A–2B are electron microscope photographs of polished sections through a silicon wafer in which polysilicon-filled trenches have been introduced.

A photograph of a polished fracture through the silicon wafer which corresponds to the state illustrated in FIG. 1C is reproduced in FIG. 2A. The hose-like void 7 and also the funnel-shaped termination 8 of the filling made of polysilicon 6 are clearly discernible in the photograph.

Figure 1D:
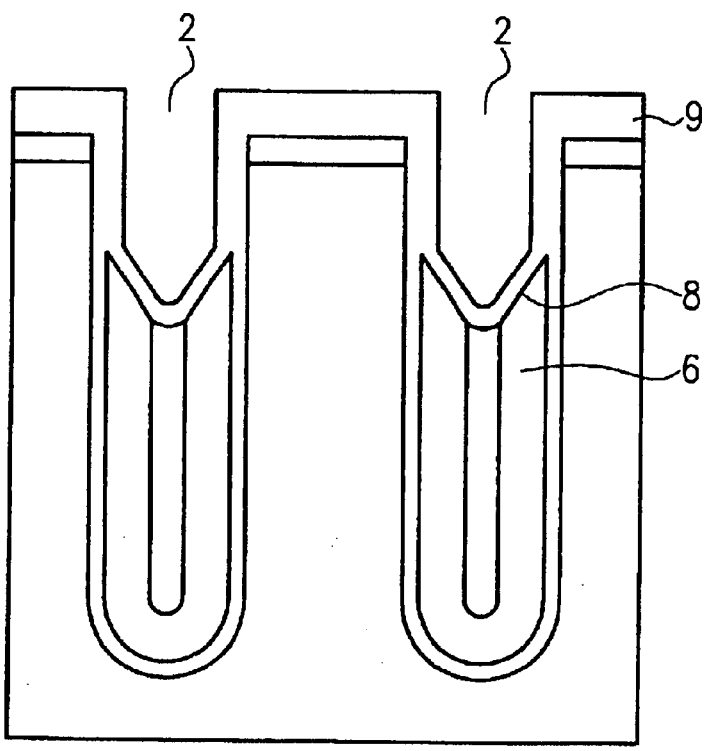
Figure 1E:
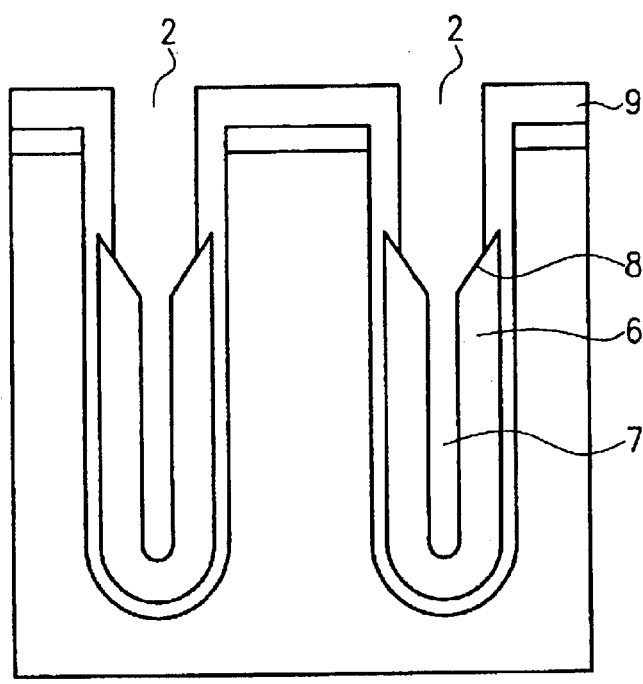
Figure 1F:
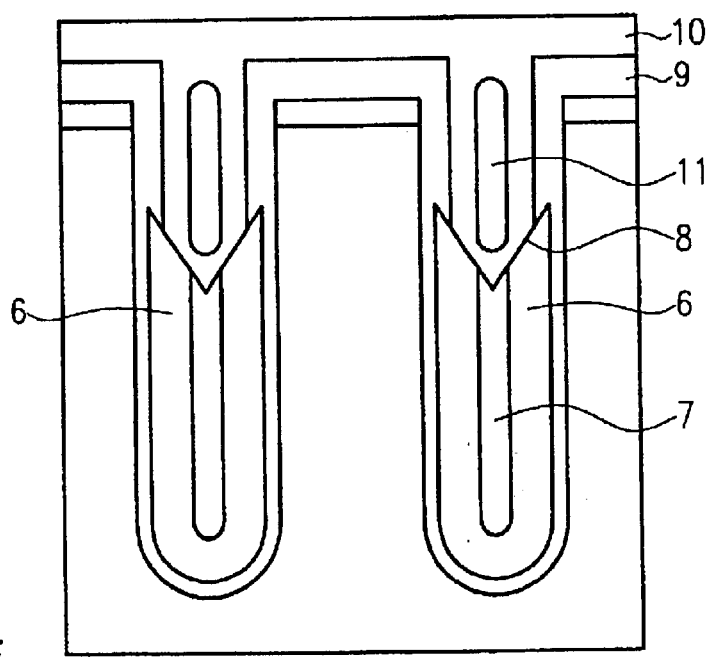

In the next work step, in the upper section of the trenches 2 that has been uncovered by the etching-back, first the thin oxide layer 5 is removed and a nitride layer 9 is then deposited in the uncovered section of the trenches 2 in a CVD method. As illustrated in FIG. 1D, the nitride layer 9 lines the inner areas of the uncovered sections of the trenches 2. In order to fabricate an insulating collar, the nitride layer 9 is then etched away again anisotropically in the lower sections in order that the upper termination of the filling made of polysilicon 6 is uncovered again. In this case, however, owing to the inclined areas of the funnel-shaped termination 8, residues of the nitride layer 9 may still remain on the polysilicon 6, which later leads to an increased contact resistance within the electrode material in the completed top electrode. The hose-like voids 7 and the funnel-shaped termination 8 of the filling made of polysilicon 6 are uncovered again as a result of the anisotropic etching-back of the nitride layer, as illustrated in FIG. 1E. Finally, the section of the trenches 2 which is lined with the nitride layer 9 is filled with polysilicon, resulting in a state as is illustrated in FIG. 1F. A further filling made of polysilicon 10 is deposited on the filling made of polysilicon 6, a hose-like void 11 again having formed. Owing to the funnel-shaped termination 8, the filling made of polysilicon 10 has, at its lower end, a wedge-form projecting into the hose-like void 7. Residues of the nitride layer 9 that have remained on the funnel-shaped termination 8 lead to an increased electrical resistance between the fillings 6 and 10 made of polysilicon.

Figure 2B:
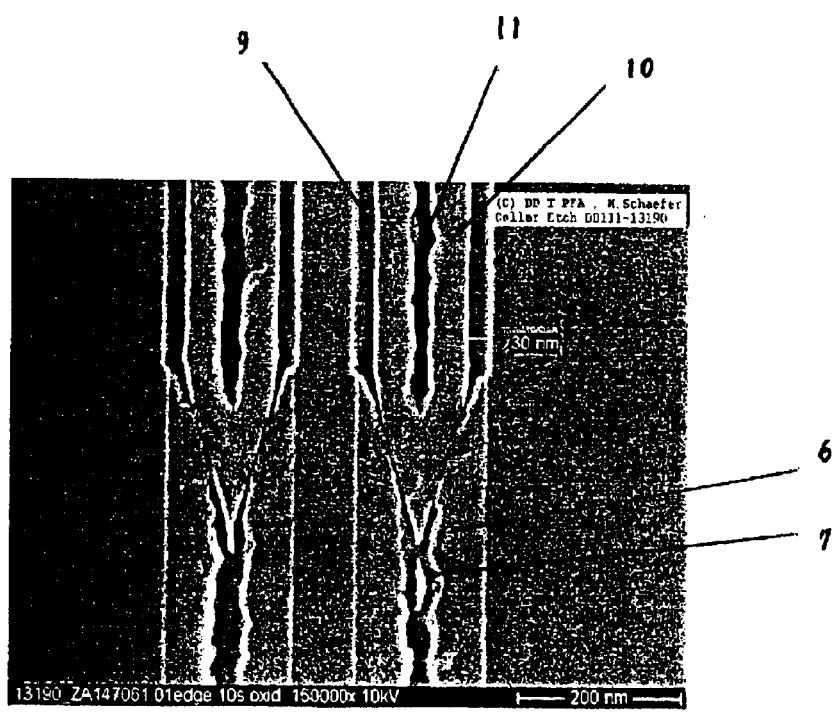

FIG. 2B shows a photograph of a polished fracture through a silicon wafer which corresponds to the state illustrated in FIG. 1F. The voids 7 and 11, respectively, in the fillings 6 and 10 made from polysilicon are clearly discernible. The upper filling 10 made of polysilicon projects like an arrow into the void 7 of the lower polysilicon fillings 6. The upper polysilicon filling 10 is laterally bounded by a collar made of the nitride layer 9, whose spurs extend right into the boundary region between the upper polysilicon filling 10 and the lower polysilicon filling 6 and increase the contact resistance between the two fillings 6, 11.

Figure 3A:
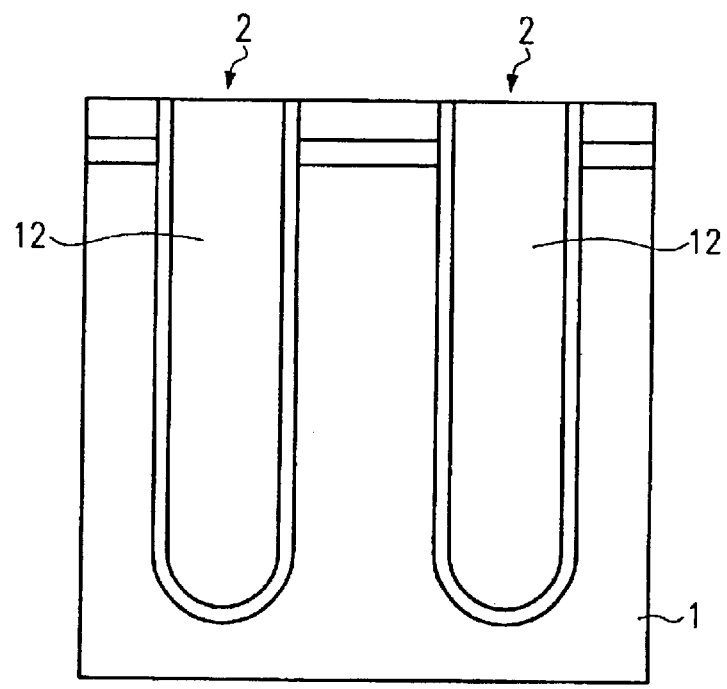
FIGS. 3A–3D are diagrammatic sectional views of various process steps in the fabrication of a deep trench capacitor, the method according to the invention being used to fill the trenches.
Figure 3B:
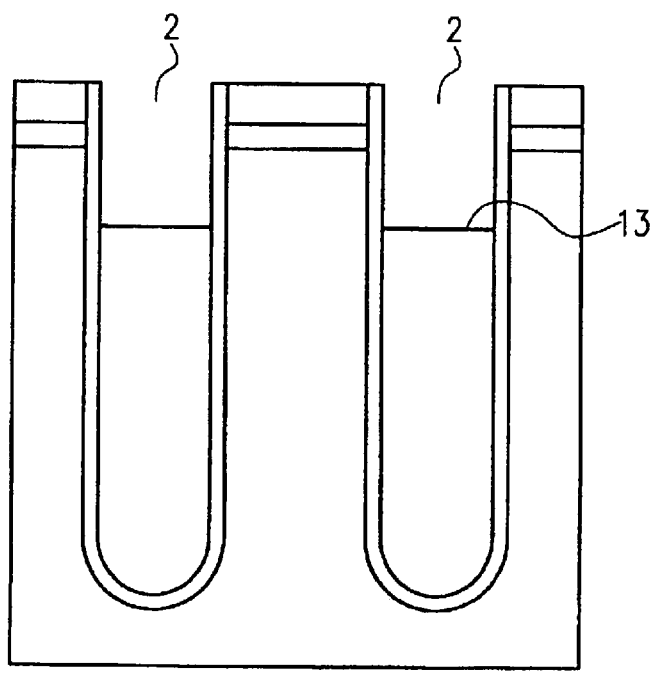
Figure 3C:
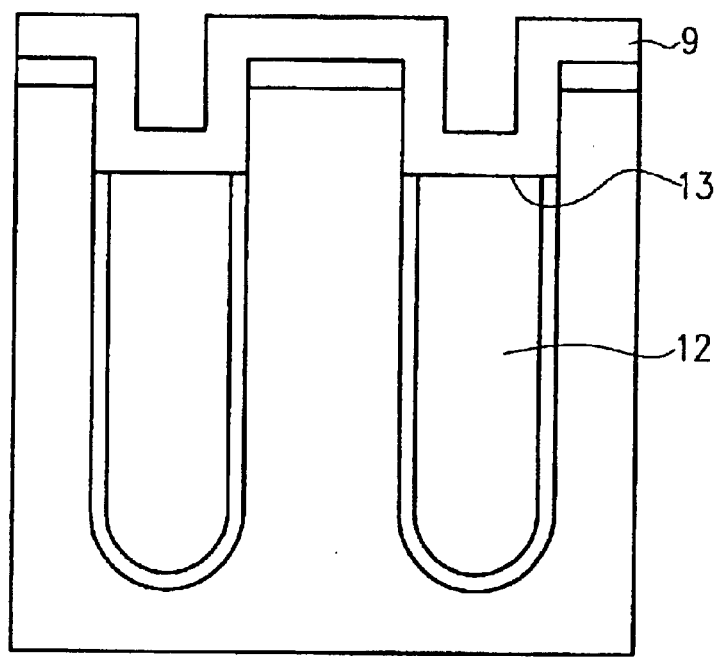
Figure 3D:
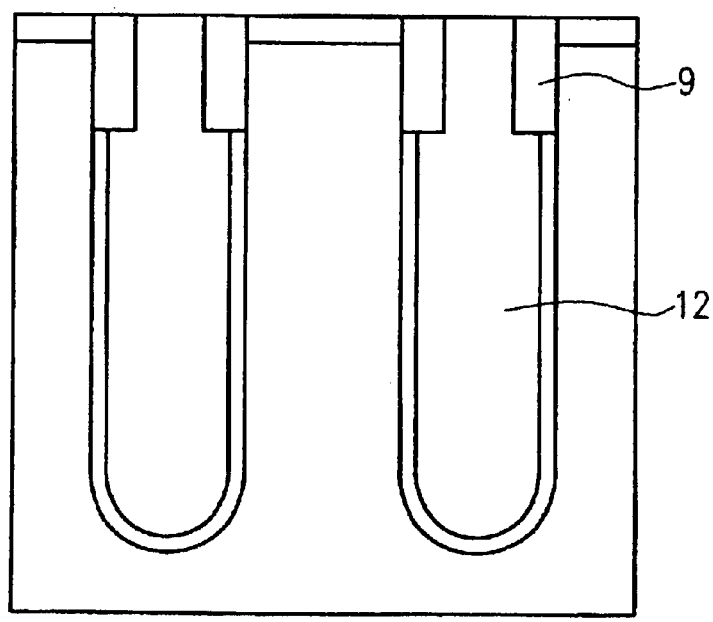

With the use of the method according to the invention, it is possible to avoid the formation of voids 7 and 11. The diagrammatic sequence of the steps of the method according to the invention is illustrated in FIGS. 3A–3D. First, as described above, trenches are produced in the silicon wafer 1, resulting in the state illustrated in FIG. 1A. According to the invention, a precursor compound of a metal layer to be deposited, for example $W(CO)_6$, is then condensed into the trenches 2. To that end, the silicon wafer is cooled, so that the trenches 2 are filled with liquid tungsten hexacarbonyl. Excess tungsten hexacarbonyl that has deposited on the top side of the wafer can be removed by being spun off, for example. In the case of trenches 2 with a very high aspect ratio, the trenches are not filled completely, rather the precursor compound is condensed out only in the lower section of the trenches 2 and then decomposed thermally by heating of the wafer, so that metallic tungsten is deposited and gaseous carbon monoxide escapes from the trenches 2. After the formation of a first section made of tungsten metal, tungsten hexacarbonyl is again condensed into the trenches 2 and then decomposed thermally. In the case of trenches having a depth of approximately 8 $\mu$m and an opening diameter of approximately 100 nm, the deposition of the tungsten metal requires approximately 10 cycles in order to completely fill the trenches 2. After the deposition of the tungsten metal has concluded, a state as is illustrated diagrammatically in FIG. 3A is obtained. The trenches 2 introduced into the semiconductor substrate 1 are completely filled with tungsten metal 12, no voids having formed in the layer of the tungsten metal 12. Afterward, as described above, the tungsten metal is etched back isotropically, for example using plasma produced from a gas mixture containing $CF_4$ and $O_2$. However, since no voids are formed in the tungsten metal 12, the upper termination of the tungsten filling of the trenches 2 can be set back approximately parallel, so that, as illustrated in FIG. 3B, a planar area 13 forms which runs perpendicular to the longitudinal axis of the trenches 2. The nitride layer 9 is then deposited analogously to the methods described for FIG. 1B, which nitride layer 9, as illustrated in FIG. 3C, lines the areas of the uncovered section of the trenches 2. Owing to the planar area 13 forming the upper termination of the tungsten filling 12, the section of the nitride layer 9 deposited thereon can readily be etched back isotropically, so that the area 13 of the tungsten filling 12 is again uncovered. Finally, liquid tungsten hexacarbonyl is again condensed into the uncovered section of the trenches 2 and decomposed thermally, with the result that the state illustrated in FIG. 3D is achieved. A continuous tungsten filling 12 has formed which is bounded by a collar made of the nitride layer 9 in the upper section.

Figure 4A:
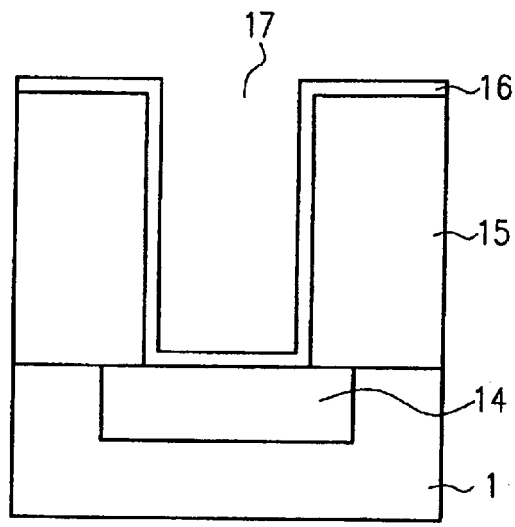
FIGS. 4A–4C are diagrammatic sectional views of the work steps when filling a contact hole, the contact hole being filled by a CVD method according to the prior art.

Furthermore, the method according to the invention is outstandingly suitable for filling contact holes. First, the sequence when using a conventional CVD method will be explained with reference to FIGS. 4A–4C. FIG. 4A illustrates the semiconductor substrate 1 into which a semiconductor component 14 is integrated, to which an electrical connection extending through a dielectric 15 is to be fabricated. To that end, a contact opening 17 is introduced into the dielectric 15, the contact opening 17 extending as far as the semiconductor component 14. In order to prevent destruction of the semiconductor component 14 and of the dielectric 15, a diffusion barrier layer 16 made of titanium nitride is deposited. A filling made of tungsten silicide is then produced, for which purpose $WF_6$ and silane ($SiH_4$) are supplied from the gas phase. The precursor compounds react with one another and are deposited as tungsten silicide uniformly on the surface. The layer thickness of the tungsten silicide gradually increases, so that the free space of the contact opening 17 gradually narrows. Due to gradual differences in the deposition rate, at the end of the deposition of the tungsten silicide layer 18, the remaining inner space of the contact opening 17 closes off and a hose-like void 19 forms (FIG. 4B).

Figure 4B:
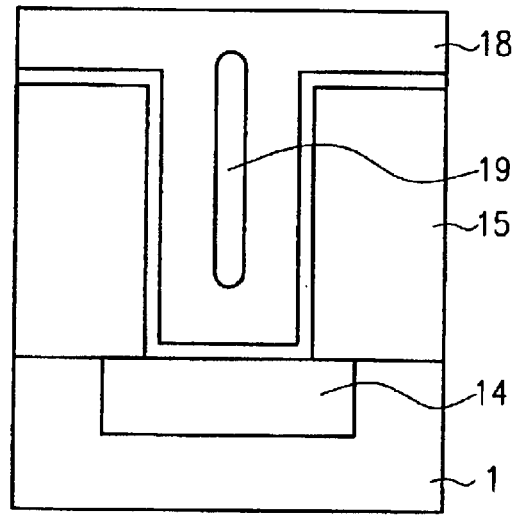
Figure 5:
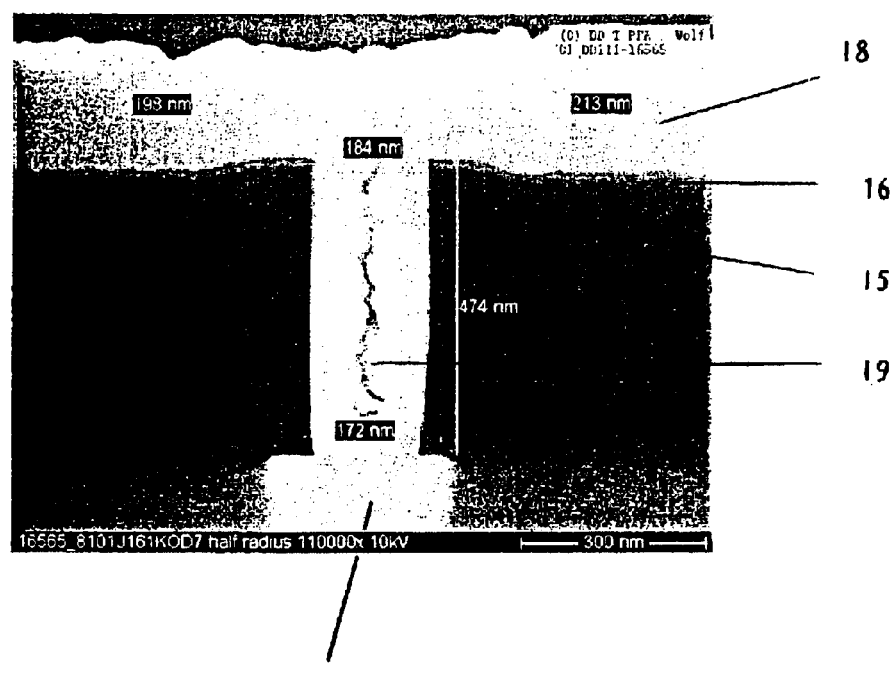
FIG. 5 is a photograph of a polished section through a silicon wafer containing an electrical contact that has been fabricated by a CVD method according to the prior art.

FIG. 5 shows a photograph of a polished fracture through a silicon wafer that corresponds to the illustration from FIG. 4B. The tungsten silicide layer 18 is clearly discernible, the void 19 having formed in the section of the contact opening 17.

Figure 4C:
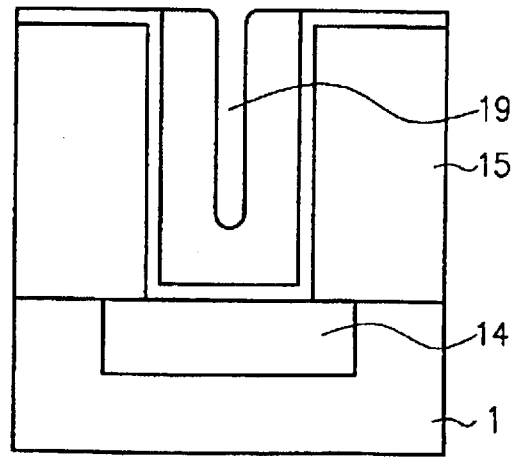

The tungsten silicide layer deposited on the top side of the dielectric 15 is finally removed in a CMP step. In this case, as illustrated in FIG. 4C, the hose-like void 19 is reopened. The void 19 can take up contaminants that may originate from the polishing agent, for example. In further production steps, these contaminants may then lead to destruction of the electrical semiconductor element.

Figure 6A:
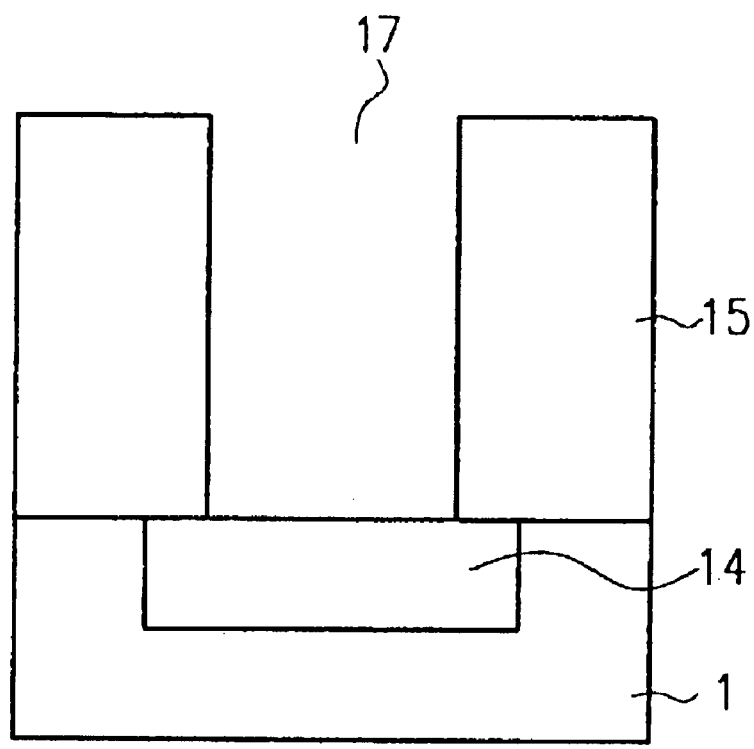
FIGS. 6A–6B are diagrammatic sectional views of work steps for fabricating an electrical contact, the method according to the invention having been used to fill the contact hole.
Figure 6B:
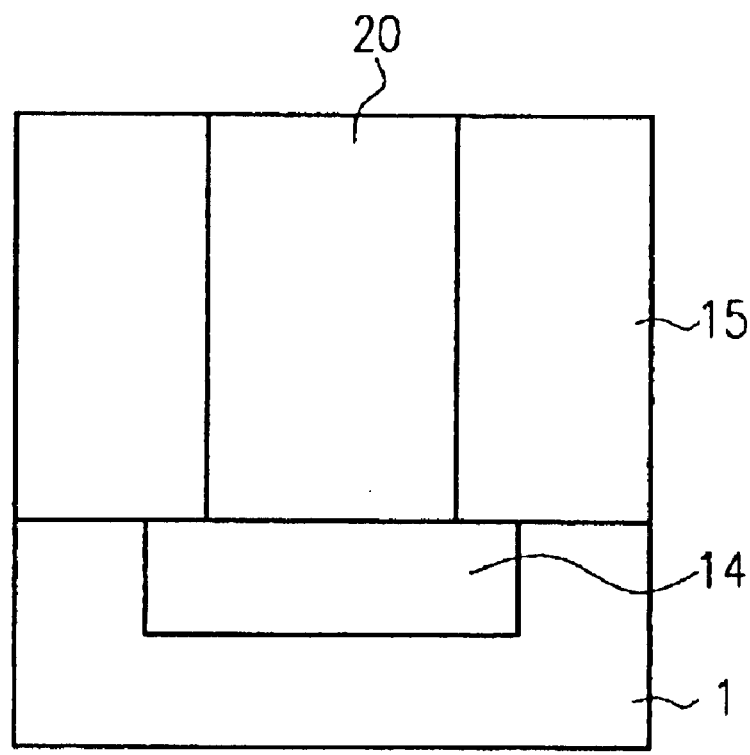

The formation of a void can be effectively avoided by the method according to the invention. The sequence is illustrated diagrammatically in FIGS. 6A–6B. Analogously to FIG. 4A, FIG. 6A illustrates the semiconductor substrate 1 into which the semiconductor component 14 is integrated. Disposed on the semiconductor substrate 1 is the dielectric 15 into which the contact opening 17 is introduced, which extends as far as the semiconductor component 14. In contrast to the CVD method described above, no aggressive chemicals are used in the method according to the invention, so that it is possible to dispense with the deposition of a diffusion barrier layer. The precursor compound of the metal to be deposited, for example tungsten hexacarbonyl, is condensed into the contact opening 17 and then decomposed thermally. A state as illustrated in FIG. 6B is obtained. The contact opening 17 is completely filled with pure tungsten metal 20, no voids having formed. Therefore, no contamination can penetrate into the contact 20 during the final CMP step.

We claim:

1. A method for producing a capacitor electrode of a deep trench capacitor, which comprises the steps of:

a) providing a semiconductor substrate having a surface and a trench formed therein;

b) applying at least one precursor compound of at least one metal in a fluid phase to the trench;

c) decomposing the precursor compound resulting in a formation of a metal layer;

d) etching back the metal layer in an upper section of the trench;

e) covering an uncovered section of the trench with an isolating layer; and f) repeating steps b) and c) in the upper section of the trench for forming the capacitor electrode.

2. The method according to claim 1, which further comprises forming the precursor compound to contain a metal in a zero oxidation state.

3. The method according to claim 1, which further comprises thermally decomposing the precursor compound during the decomposing step.

4. The method according to claim 1, which comprises applying the precursor compound to the trench as a solution dissolved in a solvent.

5. The method according to claim 1, which further comprises applying the precursor compound to the trench in condensed form.

6. The method according to claim 1, which further comprises condensing out of a gas phase the precursor compound in the trench.

7. The method according to claim 6, which further comprises cooling an area around the trench to a temperature lying below a temperature of the gas phase above the semiconductor substrate for condensing out the precursor compound.

8. The method according to claim 1, which further comprises forming trenches in the semiconductor substrate, the trenches being open toward a side of the surface of the semiconductor substrate, so that walls of the trenches form parts of the surface of the semiconductor substrate.

9. The method according to claim 8, in which further comprises producing a temperature gradient perpendicular to openings of the trenches in the semiconductor substrate.

10. The method according to claim 1, which further comprises forming the precursor compound as a metal complex having at least one metal atom and ligands bonded to the metal atom.

11. The method according to claim 10, which further comprises selecting the metal atom from the group consisting of from tungsten, molybdenum, nickel and titanium.

12. The method according to claim 10, which further comprises selecting the ligands from the group consisting of carbon monoxide, cycloolefins, and olefins.

* * * * *